(12) United States Patent
Hausmann et al.

(10) Patent No.: US 10,763,108 B2
(45) Date of Patent: Sep. 1, 2020

(54) GEOMETRICALLY SELECTIVE DEPOSITION OF A DIELECTRIC FILM

(71) Applicant: Lam Research Corporation, Fremont, CA (US)

(72) Inventors: Dennis M. Hausmann, Lake Oswego, OR (US); Alexander R. Fox, Portland, OR (US); David Charles Smith, Lake Oswego, OR (US); Bart J. van Schravendijk, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/681,268

(22) Filed: Aug. 18, 2017

(65) Prior Publication Data

US 2019/0057858 A1    Feb. 21, 2019

(51) Int. Cl.
*H01L 21/02*    (2006.01)
*H01L 21/311*    (2006.01)

(52) U.S. Cl.
CPC ...... *H01L 21/0228* (2013.01); *H01L 21/0217* (2013.01); *H01L 21/02164* (2013.01); *H01L 21/02167* (2013.01); *H01L 21/02181* (2013.01); *H01L 21/02186* (2013.01); *H01L 21/02189* (2013.01); *H01L 21/02211* (2013.01); *H01L 21/02219* (2013.01); *H01L 21/02274* (2013.01);
(Continued)

(58) Field of Classification Search
CPC ............. H01L 21/0228; H01L 21/0217; H01L 21/02164; H01L 21/02167; H01L 21/31116; H01L 21/3141

USPC ................ 438/696, 699, 700, 702, 703, 757
See application file for complete search history.

(56) References Cited

U.S. PATENT DOCUMENTS

| | | |
|---|---|---|
| 7,094,701 B2 | 8/2006 | Umemoto et al. |
| 8,492,854 B1 | 7/2013 | Cheng et al. |
| 8,878,311 B2 | 11/2014 | Cheng et al. |

(Continued)

FOREIGN PATENT DOCUMENTS

| | | |
|---|---|---|
| JP | 2006-032695 | 2/2006 |
| KR | 10-2014-0069326 | 6/2014 |

OTHER PUBLICATIONS

Chemicool Dictionary "Definition of Step Coverage" via https://www.chemicool.com/definition/step_coverage.html ; 1 page; 2017.*

(Continued)

*Primary Examiner* — Binh X Tran
(74) *Attorney, Agent, or Firm* — Weaver Austin Villeneuve & Sampson LLP

(57) ABSTRACT

Provided are methods for the selective deposition of material on a sidewall surface of a patterned feature. In some embodiments, the methods involve providing a substrate having a feature recessed from a surface of the substrate. The feature has a bottom and a sidewall which extends from the bottom. A conformal film is deposited on the feature using an atomic layer deposition (ALD) process. The conformal film deposited on the bottom is modified by exposing the substrate to directional plasma such that the conformal film on the bottom is less dense than the conformal film on the sidewall. The modified conformal film deposited on the bottom of the feature is preferentially etched. Also provided are methods for the selective deposition on a horizontal surface of a patterned feature.

11 Claims, 12 Drawing Sheets

(52) U.S. Cl.
CPC ... *H01L 21/31111* (2013.01); *H01L 21/31116* (2013.01); *H01L 21/31122* (2013.01)

(56) References Cited

U.S. PATENT DOCUMENTS

| | | | |
|---|---|---|---|
| 8,985,379 | B1 | 3/2015 | Evans |
| 9,368,579 | B2 | 6/2016 | Balram et al. |
| 2004/0048441 | A1 | 3/2004 | Akatsu et al. |
| 2007/0049032 | A1 | 3/2007 | Abatchev et al. |
| 2008/0182409 | A1 | 7/2008 | Seidel et al. |
| 2010/0173494 | A1 | 7/2010 | Kobrin |
| 2011/0207323 | A1 | 8/2011 | Ditizio |
| 2012/0077349 | A1* | 3/2012 | Li .................... C23C 16/45542 438/762 |
| 2013/0084688 | A1 | 4/2013 | O'Meara et al. |
| 2013/0175606 | A1 | 7/2013 | Cheng et al. |
| 2014/0106574 | A1* | 4/2014 | Kang .................. H01L 21/022 438/778 |
| 2017/0062204 | A1* | 3/2017 | Suzuki ............... H01L 21/0228 |
| 2017/0221718 | A1 | 8/2017 | Tapily |
| 2017/0250068 | A1* | 8/2017 | Ishikawa ............ H01L 21/0217 |
| 2017/0263437 | A1* | 9/2017 | Li ...................... H01L 21/0217 |
| 2017/0316940 | A1* | 11/2017 | Ishikawa ........... H01L 21/02211 |

OTHER PUBLICATIONS

Denser—definition of denser by the Free Dictionary via https://www.thefreedictionary.com/denser ; pp. 1-5; 2003.*

Wikipedia "Density" via https://en.wikipedia.org/wiki/Density ; pp. 1-11; 2019.*

International Search Report and Written Opinion issued in Application No. PCT/US2018/000331 dated Feb. 11, 2019.

\* cited by examiner

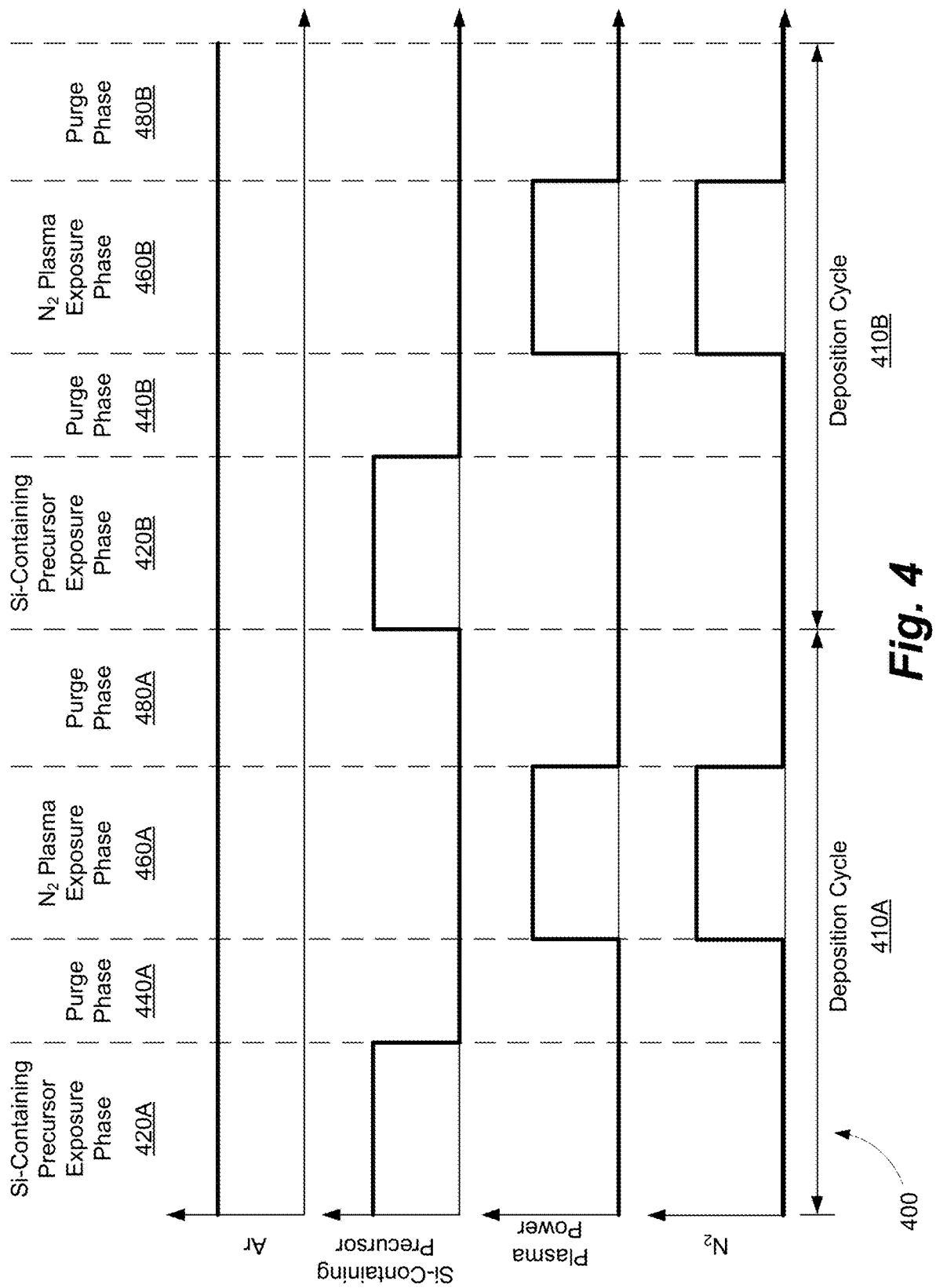

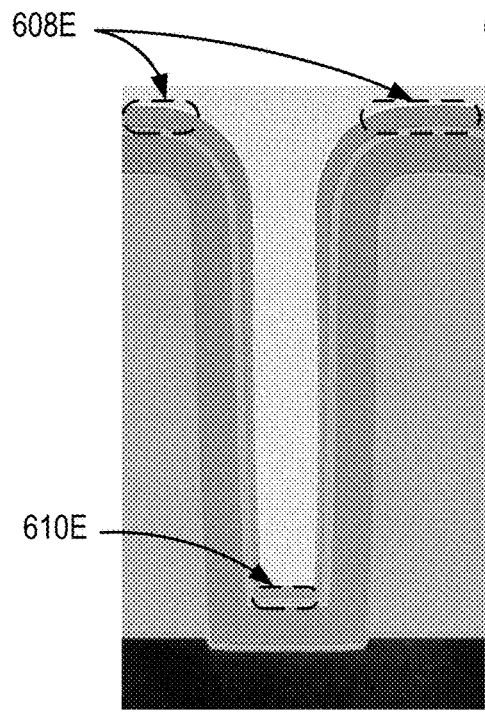
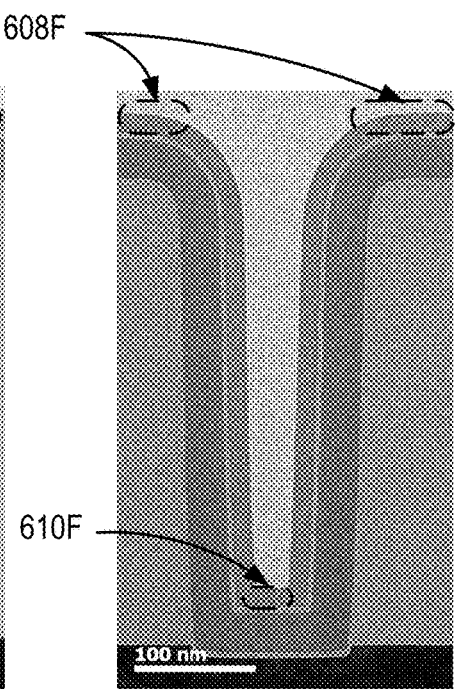
*Fig. 6E*  *Fig. 6F*
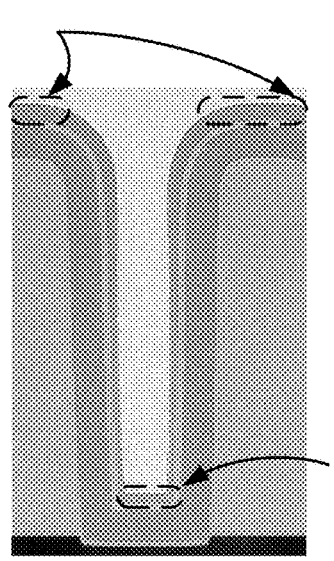
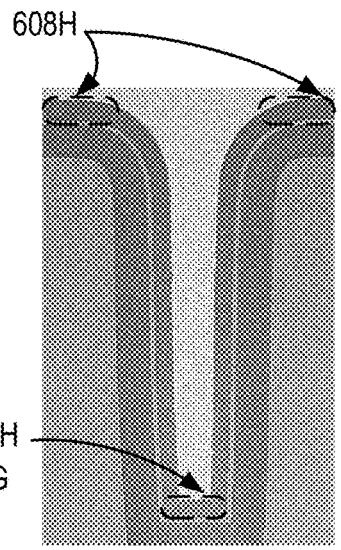
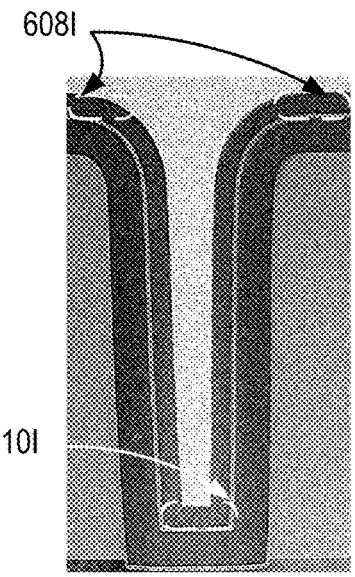
*Fig. 6G*  *Fig. 6H*  *Fig. 6I*

GEOMETRICALLY SELECTIVE DEPOSITION OF A DIELECTRIC FILM

BACKGROUND

As device and feature sizes continue to shrink in the semiconductor industry, there is a need for processing methods to assist device shrinking and to enable specific three-dimensional architectures. Current semiconductor fabrication schemes may benefit from the deposition of material on the sidewall of a patterned feature without depositing material on the bottom, or top, of the feature.

SUMMARY

One aspect of the subject matter described herein relates to methods for the selective deposition of material on a sidewall surface of a patterned feature. The methods involve providing a substrate having a feature recessed from a surface of the substrate. The feature has a bottom and a sidewall that extends from the bottom. A conformal film is deposited on the feature using an atomic layer deposition (ALD) process. The conformal film deposited on the bottom is modified by exposing the substrate to a directional plasma such that the conformal film on the bottom is less dense than the conformal film on the sidewall. The modified conformal film deposited on the bottom of the feature is preferentially etched.

In some embodiments, the ALD process is a plasma-enhanced ALD (PE-ALD) process that uses the directional plasma during the deposition of the conformal film. Further, in various embodiments, the PE-ALD process includes cycles of: (a) exposing the substrate to a silicon-containing precursor to form an adsorbed layer of the silicon containing precursor on the substrate surface, and (b) exposing the adsorbed layer to the directional plasma.

In some embodiments, the depositing and the modifying are conducted concurrently.

In some embodiments, the directional plasma is generated from ammonia ($NH_3$) and the conformal film is a silicon nitride (SiN) film.

In some embodiments, the directional plasma is generated from an oxygen-containing gas and the conformal film is a silicon oxide film.

In some embodiments, the directional plasma is generated from an amine-containing gas and the conformal film is a silicon carbide film.

In some embodiments, exposure of the modified areas to the directional plasma reduces carbon content of the conformal film at the modified areas.

In some embodiments, the directional plasma is an oxygen-containing plasma and the modifying the conformal film on the bottom comprises removing carbon.

In some embodiments, the deposited conformal film is selected from a group consisting of: hafnium oxide ($HfO_2$), zirconium oxide ($ZrO_2$), and titanium oxide ($TiO_2$).

In some embodiments, the etching comprises a wet etch.

In some embodiments, the etching comprises a plasma etch.

Another aspect of the subject matter described herein relates to methods for depositing a conformal film on exposed horizontal surfaces of a feature. The methods involve providing a substrate having a feature recessed from a surface of the substrate. The feature has a bottom and a sidewall that extends from the bottom. A conformal film on the feature is deposited using an atomic layer deposition (ALD) process. The ALD process involves exposing the substrate to a directional plasma such that the thickness of the conformal film deposited on the bottom is greater than the thickness of the conformal film deposited on the sidewall.

In some embodiments, the method involves preferentially etching the conformal film deposited on the sidewall of the feature.

In some embodiments, the ALD process is a plasma-enhanced ALD (PE-ALD) process that uses the directional plasma during the deposition of the conformal film.

In some embodiments, the directional plasma is generated from nitrogen ($N_2$) and the conformal film is silicon nitride film.

In some embodiments, the directional plasma is provided by a capacitively coupled reactor (CCP).

These and other aspects are described further below with reference to the drawings.

BRIEF DESCRIPTION OF THE DRAWINGS

FIG. 4 is a timing sequence diagram showing an example of cycles.

FIGS. 6E-6I are images of experimental results.

DETAILED DESCRIPTION

Figure 1A:
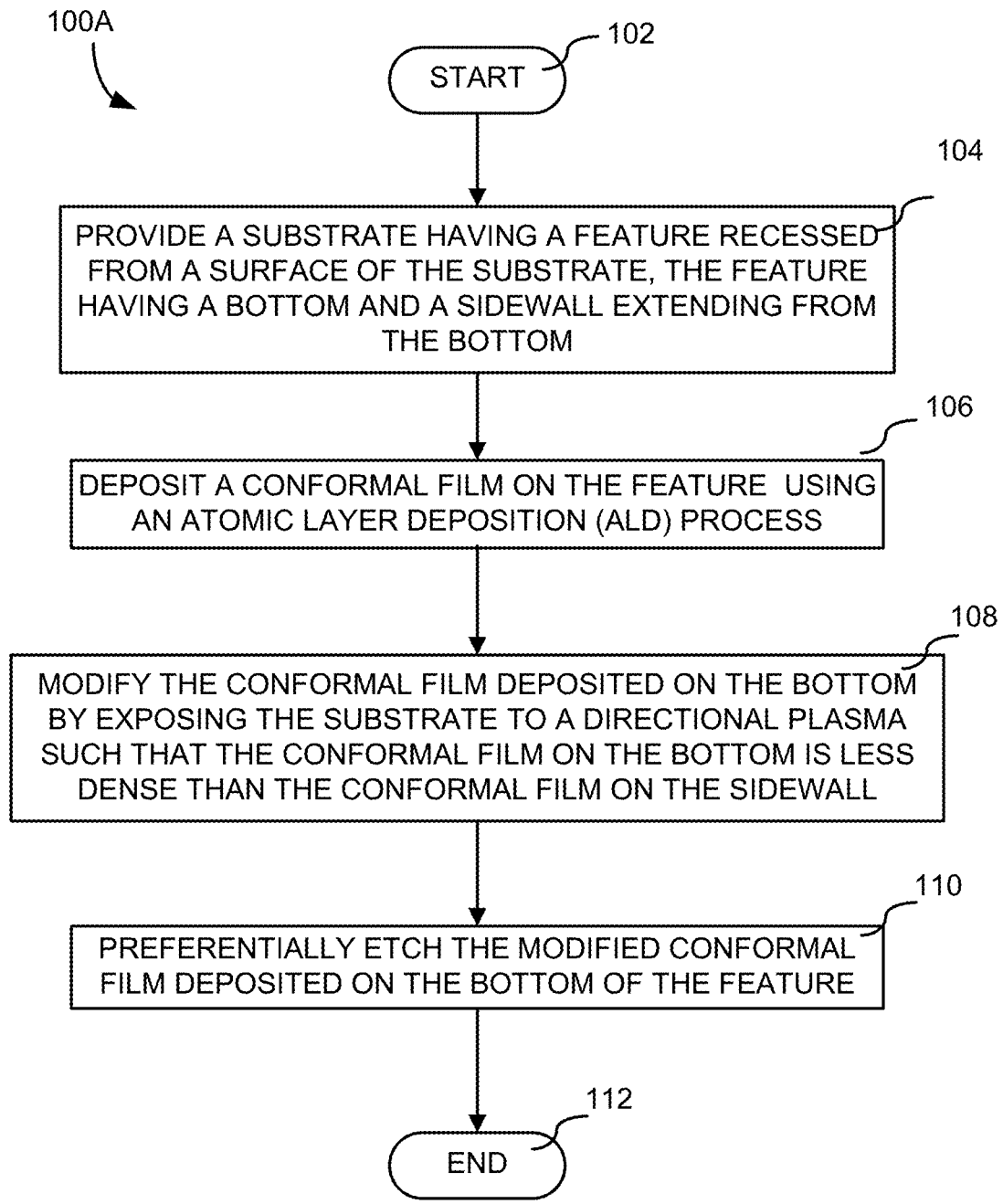
FIG. 1A is a process flow diagram showing modification of a conformal film deposited on a feature.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that the specific embodiments are not intended to limit the disclosed embodiments.

The implementations disclosed below describe deposition of a material on a semiconductor substrate such as a wafer or other work piece. The substrate has a feature recessed from a surface of the substrate. The substrate may be of various shapes and sizes, and comprise various materials.

Current semiconductor integration schemes may benefit from the deposition of a material on the sidewall of a patterned feature, with or without reduced deposition of the material on exposed horizontal surfaces of the feature, such as the bottom or field area (top) of the feature. Similarly, certain integration schemes may benefit from the deposition of a material on one or both of the top and bottom horizontal surfaces of a feature with reduced deposition on the sidewalls surfaces. Such deposition processes are geometrically selective in that they selectively deposit on part of a feature geometry relative to another part of a feature geometry. However, single-step deposition methods that deposit a film only on the sidewall of a feature relative to the top and bottom, independent of the chemical composition of the sidewall, are not known.

Provided herein are methods of geometrically selective deposition of dielectric films on patterned features. Also provided are apparatuses configured to perform the disclosed methods. In some embodiments, a film such as silicon nitride (SiN) is conformally deposited in a feature using an atomic layer deposition (ALD) process. The feature may be recessed from the top of a substrate and defined by a feature bottom and sidewalls extending from the feature bottom toward the substrate top. In some embodiments, the substrate is exposed to a directional (i.e., anisotropic) plasma concurrently during the deposition of SiN on the substrate to modify exposed horizontal surfaces of the feature to prepare these horizontal surfaces for subsequent etch. Alternatively, in some embodiments, modification of the exposed horizontal surfaces of the feature may be conducted subsequent to deposition. A wet or dry etch is then conducted to preferentially remove areas of the film that were previously modified. As a result, more deposited material remains on the sidewalls than on the horizontal surfaces.

In alternative embodiments, plasma application may be tuned to preferentially create active sites for deposition on certain areas of a feature. For example, ion-rich plasma generated from nitrogen gas ($N_2$) may be flowed toward a SiN film that conformally deposited on the feature to create active sites on exposed horizontal surfaces of the SiN film. The plasma may have a higher concentration of ions than radicals and may be applied in short bursts such that the thickness of conformal SiN film deposited on the bottom and top of the feature is greater than the thickness of the conformal SiN film deposited on sidewalls of the feature. Subsequent etch of SiN film deposited in the feature may remove all or most of the film from the feature sidewall, leaving SiN material at the thickened areas at the bottom or top of the feature.

As introduced above, tuning of plasma applied to the feature during deposition may modify deposited film on the feature in preparation for subsequent etch. Methods disclosed herein may involve use of trisilylamine (TSA) as a silicon source and ammonia ($NH_3$) as a nitrogen source to form silicon nitride (SiN), which may be deposited on the feature as a conformal film by plasma-enhanced atomic layer deposition (PE-ALD). Application of bias to the substrate surface, along with high-power and high-pressure settings for subsequent flowing of etchant species, may etch the modified areas of the deposited SiN film.

Alternatively, in other embodiments, ion-rich plasma derived from $N_2$ gas may be directionally applied to certain areas of the SiN film deposited on the feature, such as at the top and bottom. Application of the ion-rich plasma may create active sites suitable for additional deposition of SiN on the SiN film to thicken the areas.

Deposition processes may be adjusted to achieve either of the results described above, namely (1) deposition with concurrent modification of films on horizontal surfaces to prepare the modified film for later etch; or (2) thickening of material on horizontal surfaces by deposition of additional film thereon.

A method 100A for depositing material on the sidewalls of a feature on a substrate is shown in FIG. 1A. In operation 102 the method 100A is initiated. In operation 104, a substrate, such as a semiconductor substrate, is provided. The substrate may be a silicon wafer, e.g., a 200-mm wafer, a 300-mm wafer, or a 450-mm wafer. A substrate may include a wafer having one or more layers of material deposited thereon.

Figure 5A:
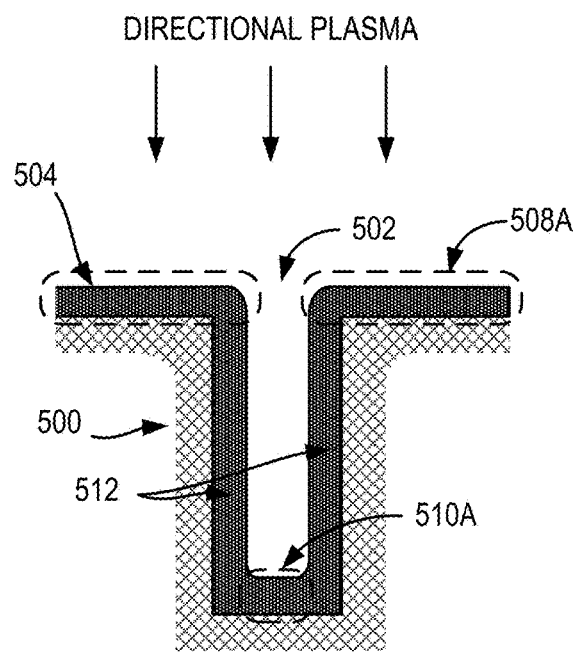
FIGS. 5A-5C are schematic illustrations that show application of directional plasma to modify a conformal film.
Figure 5B:
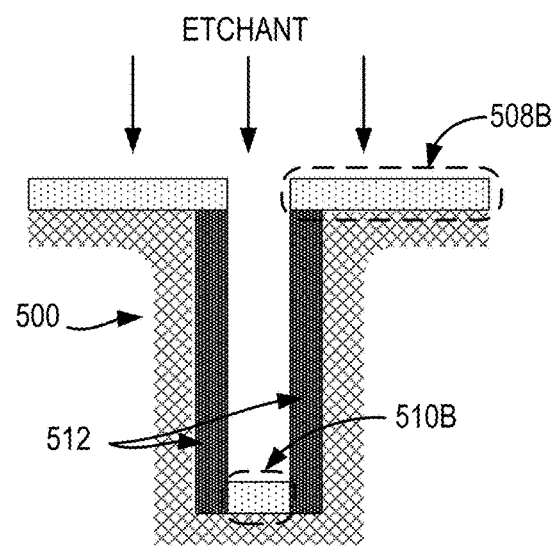
Figure 5C:
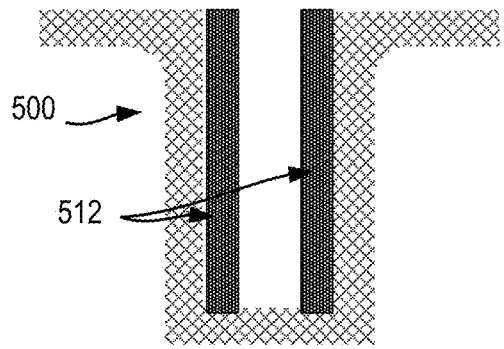

In some embodiments, the substrate provided in operation 104 may have a feature 502 as shown in FIGS. 5A-5C, recessed from the top of the substrate. An example of a feature is a trench formed in a substrate. The feature 502, formed in substrate 500 shown in FIGS. 5A-5C, has parallel sidewalls 512 that extend vertically upwards from the bottom area 510A or 510B. However, one skilled in the art will appreciate that other types of features may have sidewalls that are not perfectly parallel to each other, or may have sidewalls that do not extend vertically upwards from a defined bottom area. Reference is made throughout this disclosure to horizontal surfaces, which include the surface of the bottom area 510A and the surfaces of the top area 508A surface. The top area 508A is also referred to as a field area.

Returning to FIG. 1A, in operation 106, a conformal film, such as SiN is deposited on the feature using an atomic layer deposition (ALD) process. In some embodiments, other types of conformal films, such as hafnium oxide ($HfO_2$), zirconium oxide ($ZrO_2$), or titanium oxide ($TiO_2$) may be deposited instead of SiN. For SiN deposition, SiN may be formed by reacting a nitrogen-containing reactant, such as $NH_3$, an amine, or $N_2$ gas with a silicon-containing co-reactant, such as a silicon halide. The silicon halide may include those including chlorine (Cl), bromine (Br), or iodine (I). Methods of forming and depositing SiN on the feature are discussed in greater detail in FIG. 1B.

Generally, ALD is a method that deposits thin layers of material using sequential self-limiting reactions. In some embodiments, ALD may be performed with plasma, or may be performed thermally. Further, operation 106 may be performed in one or more cycles, referred to herein as an "ALD cycle."

The concept of an ALD cycle is relevant to discussion of certain embodiments herein. An ALD cycle, typically, is the minimum set of operations used to perform a surface deposition reaction one time. For example, the result of one successful ALD cycle is the production of at least a partial silicon-containing film layer on a desired substrate surface, such as on the feature 502 formed in substrate 500 shown in FIGS. 5A-5C. Typically, an ALD cycle includes operations to deliver and adsorb at least one reactant to the substrate surface. Thus the adsorbed reactant may react with one or more reactants residing on the substrate surface to form a partial layer of film. The ALD cycle may include other operations such as sweeping one of the reactants, or byproducts, and/or treating the partial film as deposited. Generally, a cycle contains one instance of a unique sequence of operations. As an example, an ALD cycle may include the following operations: (i) delivery/adsorption of a silicon-containing precursor, (ii) purging of silicon-containing precursor from the chamber, (iii) delivery of a second reactant, e.g. nitrogen provided by $NH_3$, and a plasma, and (iv) purging of plasma from the chamber.

Silicon nitride (SiN) may be deposited on substrates of interest via an ALD operation or cycle. Alternative to deposition of SiN, other materials, including oxides, such as hafnium oxide ($HfO_2$), zirconium oxide ($ZrO_2$), and titanium oxide ($TiO_2$) may be deposited on a feature of a substrate. For deposition of silicon-containing film various types of silicon-containing precursors may be used. For instance, to form SiN, $NH_3$ and various amines may be reacted with a silicon halide precursor including chlorine (Cl), bromine (Br) and iodine (I).

In some embodiments, the films deposited by ALD may be conformal. A conformal film follows the contours of the underlying surface. Step coverage, which is calculated by comparing the average thickness of a deposited film on the bottom, or sidewall of the feature to the average thickness of a deposited film on the top of the feature, may be used to characterize a conformal film. For example, step coverage for a particular conformal film deposited on a feature may be calculated by dividing the average thickness of the deposited film on a sidewall by the average thickness of the deposited film at the top and multiplying the result by 100 to obtain a percentage.

Returning to FIG. 1A, the conformal film deposited on the bottom of the feature is modified by exposure of the substrate to a directional plasma, at operation 108. Modification of the conformal film by the directional plasma at operation 108 results in film deposited on the bottom of the feature becoming less dense than film deposited on sidewalls extending from the bottom, as shown in FIGS. 5A-5C. Also, in some embodiments, film deposited at the top, or field areas, of the feature may also be modified upon exposure to a directional plasma, as shown by areas 508A in FIG. 5A.

Film deposited by ALD on the feature may have a lower density in comparison to other film deposition methods. The lower density may result in the film being particularly susceptible to modification upon exposure of the substrate to directional plasma. The directional plasma employed damages the film such that it is less dense and may appear "fluffier" than surrounding non-modified areas. The modified areas have a higher etch rate and so are more prone to removal upon a subsequent etch conducted at operation 110 to thus leave material preferentially deposited on sidewalls of the feature. The method 100A concludes at operation 112.

Process parameters may be optimized to modify exposed horizontal areas of the deposited film. In some embodiments, ions drive the modification of the exposed horizontal surfaces of the film. Plasma may be flowed toward the substrate while a bias is concurrently applied to a pedestal holding the substrate to attract the ions to the horizontal surfaces.

As shown in FIG. 1A, in certain embodiments, operations 106 and 108 may be conducted within the same chamber such that a conformal film is deposited and modified in the same chamber. Deposition on and modification of film deposited on the substrate may occur concurrently prior to the preferential etch at operation 110 of the modified areas of the deposited film. A method of concurrent deposition and modification is described below with respect to FIG. 1B.

In certain embodiments, all or some of operation 108 may take place subsequent to operation 106. In these embodiments, the subsequent modification may be performed in the same or a different chamber as operation 106. For example, after deposition of a conformal film, the film may be exposed to an inert gas plasma, e.g., an Ar-derived plasma. By appropriately biasing the substrate, ions in the Ar-derived plasma will preferentially modify the film deposited on the horizontal surfaces as described above.

The method described with respect to FIG. 1A may be performed using plasma-activated reactants for any type of film in addition to SiN. As indicated above, an oxide such as $HfO_2$, $ZrO_2$, and $TiO_2$ may be selectively deposited on the sidewalls of a feature. Further, other oxides such as silicon oxides (e.g. $SiO_2$), aluminum oxides (e.g. $Al_2O_3$), $SnO_2$, as well as silicon nitrides, aluminum nitrides, and tin nitrides may be deposited by the method shown in FIG. 1A.

In some embodiments, the film is a carbon-containing film. Plasma-mediated directional ion-bombardment of a carbon-containing film deposited on a feature may decrease carbon content of the film at exposed horizontal areas. This decreased carbon content will result in a difference in etch rate, at operation 110, between low-carbon content and high-carbon content areas, thus allowing for net selective deposition on sidewall surfaces. Higher carbon content in a film decreases the wet etch rate; thus depleting carbon on the horizontal surfaces increases the wet etch rate on those surfaces with respect to the sidewalls.

For example, conformal deposition of an oxygen-doped silicon carbide (ODC) or nitrogen-doped silicon carbide (NDC) film, followed by directional ion-bombardment will result in lower carbon content at the bottom and top of the feature. In some embodiments, carbon content in film deposited on the horizontal may be reduced by exposure to an oxygen-containing plasma, or a hydrogen-containing plasma derived from either hydrogen gas ($H_2$) or $NH_3$, for example. Oxygen or hydrogen contained in the plasma may react with carbon in the carbon-containing film to remove the carbon and leave behind a carbon-depleted material or residue that etches at a rate faster than other remaining non-porous deposited material.

Carbon-containing deposition processes may be tailored to control the amount of carbon directed toward the sidewalls or the horizontal surfaces of the feature. Plasma power and precursor choice in particular may be used to adjust the position of carbon input to a conformal film deposited in a feature. Carbon in a carbon-containing films deposited using lower plasma power levels may tend to segregate toward the top and the bottom of the feature, with higher power levels used to obtain more carbon in sidewalls. The amount of carbon in an amine reactant may be increased to input additional carbon into the film. Thus, in some embodiments, carbon may preferentially deposited in sidewalls surfaces prior to being preferentially depleted in the horizontal surfaces.

Returning to FIG. 1A, preferential etch at operation 110 of modified areas of a deposited carbon-containing film may be conducted by either a dry etch or a wet etch. Generally, dry etching refers to the removal of deposited material, typically a masked pattern of semiconductor material, by exposure of the material to ion-bombardment as provided by a plasma generated from reactive gases. Suitable reactive gases may include fluorocarbons, oxygen ($O_2$) gas, chlorine ($Cl_2$) gas, or boron-containing gas with occasional addition of $N_2$ gas, used to dislodge portions of material from the exposed surface. Dry etching processes typically etch directionally and may be employed to etch modified areas of deposited film, which are relatively easier to etch compared to non-modified areas of the deposited film. Any type of film, e.g. SiN, ODC or NDC may be suitably etched by dry etch.

In contrast to dry etch processes as described above, wet etch processes typically involve exposure of the substrate of interest to liquid-phase etchant species. For example, the substrate may be immersed in a bath of etchant. Any type of film, e.g. SiN, ODC or NDC may be suitably etched by dry etch. Examples of wet etchants include hydrogen fluoride (HF), buffered oxide etch (BOE), and potassium hydroxide (KOH).

Figure 1B:
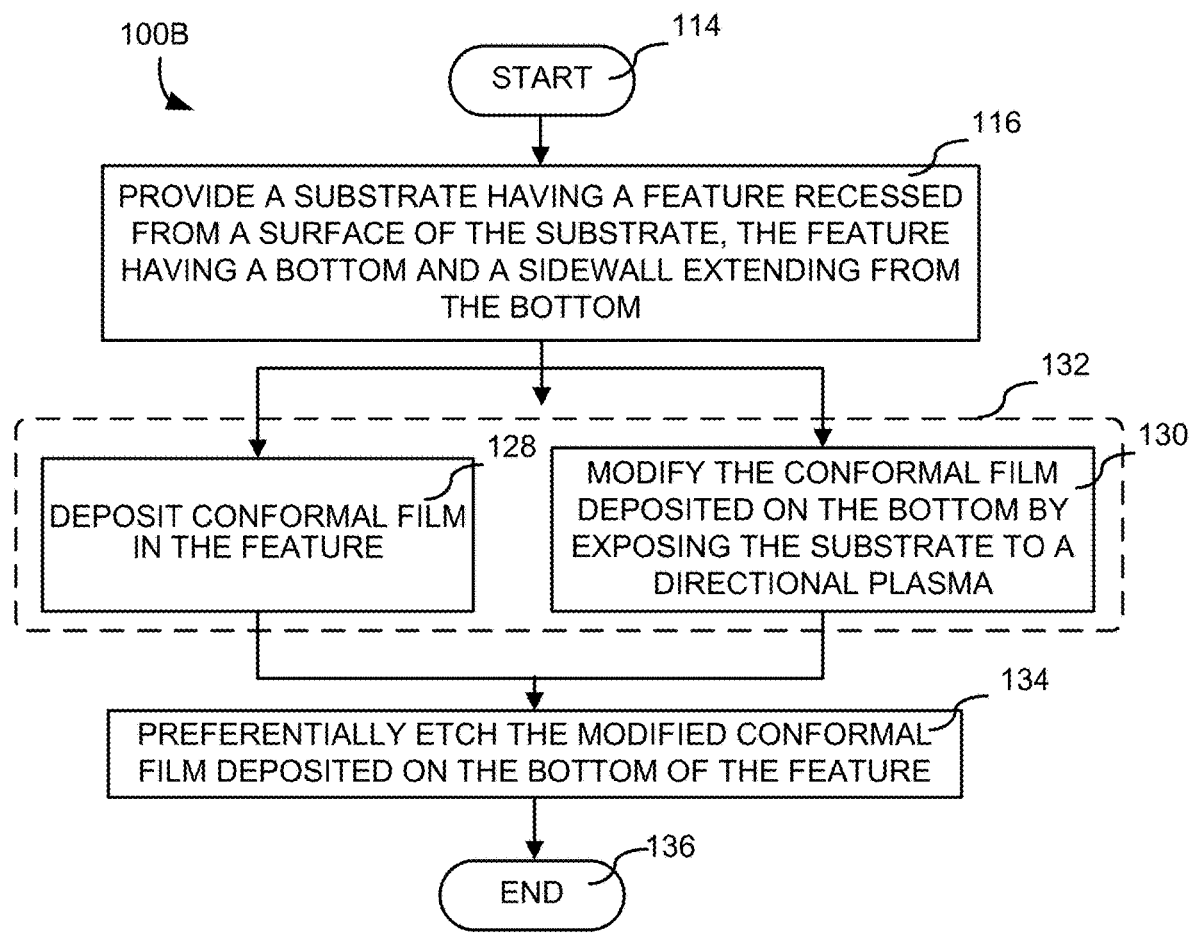
FIG. 1B is a process flow diagram showing deposition of a conformal film with concurrent modification of the conformal film.

FIG. 1B shows a method 100B for depositing and modifying a conformal film on feature of a substrate using concurrent deposition and modification is shown. The method is initiated at operation 114 and a substrate is provided to a suitable reaction chamber at operation 116, similar to operations 102 and 104 respectively, shown in FIG. 1A.

A conformal film such as SiN is deposited on the feature at operation 128. Process parameters, are tuned to achieve concurrent modification of the film deposited at the horizontal surfaces of the substrate at operation 130. In some embodiments, modification of certain areas may extend to top areas of the feature. Deposition conducted at operation 128 and concurrent modification of deposited SiN at operation 130 may be collectively referred to as operation 132. Similar to operation 110 shown in FIG. 1A earlier, operation 134 involves the preferential etch of modified areas of the deposited film to remove such areas prior to conclusion of method 100B at operation 136.

Figure 1C:
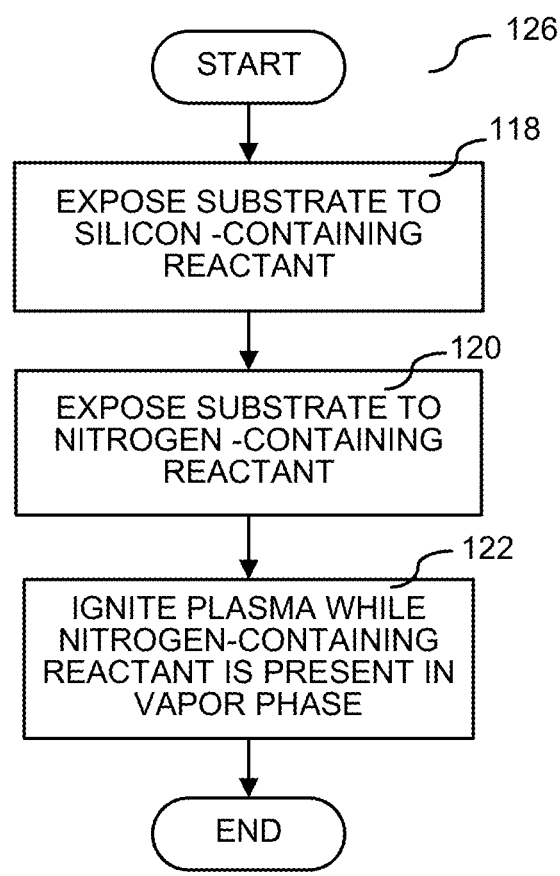
FIG. 1C is a process flow diagram showing an example of a method for forming silicon nitride.

FIG. 1C is a process flow diagram showing an example of a method 126 for generating a conformal SiN film. The method 126 may be used, for example, in blocks 106 or 128 of FIGS. 1A and 1B. The method 126 includes operations 118-122, which relate to the exposure of the substrate to a silicon-containing reactant at operation 118, the periodic exposure to a nitrogen-containing reactant at operation 120, and the periodic ignition of plasma when silicon-containing reactant flow has ceased at operation 122. Processes included in method 126 may occur as described in U.S. patent application Ser. No. 13/084,304 entitled "IMPROVED SILICON NITRIDE FILMS AND METHODS" filed on Apr. 11, 2011 assigned to Novellus Systems, Inc. incorporated herein in its entirety.

As referred to herein, a "silicon-containing reactant," as used in operation 118, is a single reagent, or a mixture of reagents, used to make a SiN material. The reagent contains at least one silicon compound. The silicon compound may be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials in certain embodiments described herein, the silicon-containing reactant is not present when a plasma is struck, or ignited. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chlorosec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively, as well as substituted mono-, di-, triand tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like.

A "nitrogen-containing reactant," as used in operation 120, contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

The plasma of operation 122 shown in FIG. 1C may be a plasma ignited in a reaction chamber or ignited remotely and delivered to the reaction chamber. Plasmas can include the reactants described herein and may include other agents, for example, a carrier gas, or reactive species such as hydrogen ($H_2$) gas. The reactants and other agents may be present in a reaction chamber when a plasma is struck, or a remote plasma may be flowed into a chamber where the reactants are present and/or the reactants and/or carrier gas may be ignited into a plasma remotely and brought into the reaction chamber. A "plasma" is meant to include any plasma known to be technologically feasible, including inductively-coupled plasmas and microwave surface wave plasmas. One of ordinary skill in the art would appreciate that advancements in technology will occur, and thus developing plasma-generating methods are contemplated to be within the scope of the disclosure.

Returning to FIG. 1C, the substrate is exposed to a silicon-containing reactant at operation 118. The substrate is exposed to a nitrogen-containing reactant at operation 120. A plasma is struck while the nitrogen-containing reactant is present in the vapor phase at operation 122, thus forming a silicon nitride (SiN) material on the substrate. In some embodiments, the silicon-containing reactant not adsorbed to the surface of the substrate is swept out of the chamber by the flow of the inert gas and/or nitrogen-containing reactant prior to striking the plasma. In other embodiments, a purge may be used to remove vapor phase silicon-containing reactant. One or more iterations of 118-122 may be performed, or repeated, to build up a SiN layer on the feature of the substrate. After the SiN film is produced to a desired thickness, the film may optionally undergo one or more post-deposition treatments. For example, the SiN film may be exposed to a hydrogen plasma to remove a desired amount of carbon from the SiN film.

As shown in FIG. 1C, operation 118 is performed prior to operation 120. However, in other embodiments, operation 120 may be performed prior to operation 118. In such an alternative configuration, a plasma in the reaction chamber may be ignited after the vapor phase flow of the silicon-containing reactant, at operation 118, has ceased.

Formation of SiN by method 126 may be or repeated to form a conformal layer on the substrate of any appropriate thickness, for example between approximately 1 nm and approximately 100 nm in thickness.

Figure 2:
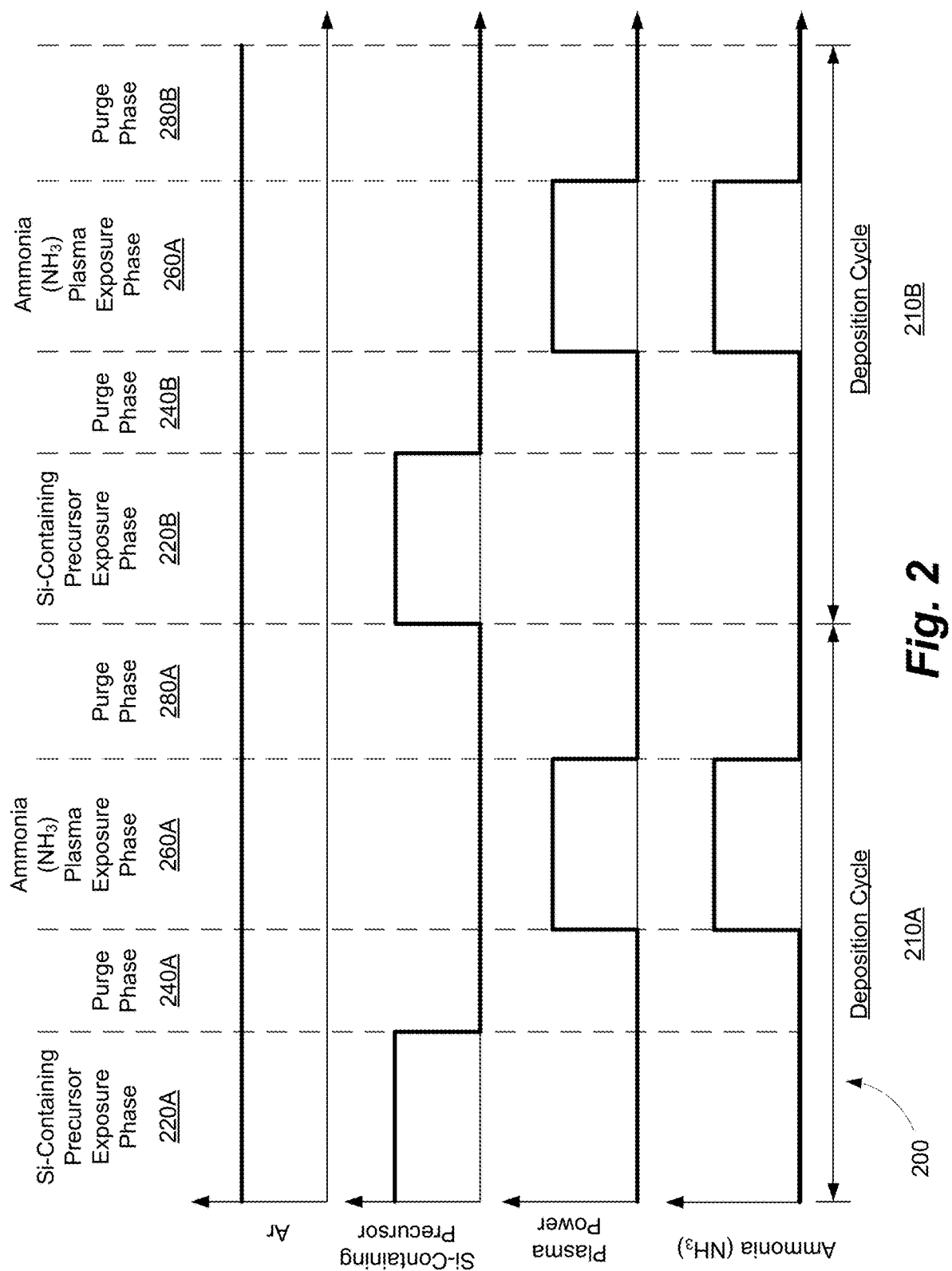
FIG. 2 shows a temporal progression of example phases in a conformal film deposition (CFD) process.

Referring to FIG. 2, a temporal progression of example phases, or pulses, in conformal film deposition (CFD) of SiN is shown. Phases shown in FIG. 2 are further described in U.S. Pat. No. 9,589,790 entitled "METHOD OF DEPOSITING AMMONIA FREE AND CHLORINE FREE CONFORMAL SILICON NITRIDE FILM" to Henri et al., issued on Mar. 7, 2017 and assigned to Lam Research Corp., incorporated herein in its entirety.

Phases in an example of an atomic layer deposition (ALD) process 200, for various process parameters, such as carrier gas flow, silicon-precursor flow, plasma, and $NH_3$ flow are shown in FIG. 2. Ar is indicated as an example carrier gas and $Si_2H_6$ may be a type of silicon-containing precursor. The solid lines extending from left to right indicate when silicon-containing precursor, or $NH_3$-containing reactant, flow or plasma are activated or deactivated. Example process parameters include, but are not limited to, flow rates for inert and reactant species, plasma power and frequency, substrate temperature, and process station pressure.

An inert gas may be flowed into the reaction chamber during deposition, e.g. in-situ deposition, of conformal film onto the feature of the substrate. The inert gas is used as a carrier gas. Example carrier gases include Ar, helium (He), and neon (Ne). In some embodiments, the carrier gas is not hydrogen, such that little to no hydrogen is incorporated into the deposited SiN film. Alternatively, a hydrogen-containing carrier gas may be used. The example sequence in FIG. 2 uses Ar as an example carrier gas, which is continuously flowed during the entire process. The inert gas may be provided to assist with pressure and/or temperature control of the process chamber, evaporation of a liquid reactant, more rapid delivery of the reactant and/or as a sweep gas for removing process gases from the process chamber and/or process chamber plumbing. In some embodiments, $NH_3$ may be flowed throughout operations 106-108 as shown for method 100A in FIG. 1A, and ignited as a $NH_3$-derived plasma thereafter.

Any number of deposition cycles may be included in an ALD process to deposit a desired film thickness of SiN. The timing sequence in FIG. 2 depicts various operations of FIG. 1A or FIG. 1B in two deposition cycles, 210A and 210B. As shown, in each cycle, the substrate is exposed to silicon-containing precursor, such as disilane. For example, during deposition cycle 210A, the substrate is exposed to the silicon-containing precursor during the silicon-containing precursor phase 220A, and during deposition cycle 210B, the substrate is exposed to the silicon-containing precursor during the silicon-containing precursor exposure phase 220B. Note that during the silicon-containing precursor exposure phases 220A and 220B, the plasma is turned off, no $NH_3$ is flowed to the reaction chamber, and the carrier gas, such as Ar, continues to flow. The substrate may be exposed to the silicon-containing precursor for a time between about 0.2 seconds and about 6 seconds, depending on the flow rate and the substrate surface area.

The substrate is exposed to the silicon-containing precursor such that the silicon-containing precursor is adsorbed onto the substrate surface to form an adsorbed layer. The silicon-containing precursor adsorbs onto the substrate surface in a self-limiting manner. For instance, once active sites are occupied by the silicon-containing precursor, little or no additional silicon-containing precursor will be adsorbed on the substrate surface. Silicon-containing precursors may be adsorbed onto about 60% of the substrate surface. When the silicon-containing precursor is flowed to the station, the silicon-containing precursor adsorbs onto active sites on the surface of the substrate, forming a thin layer of the silicon-containing precursor on the surface. This layer may be less than a monolayer, and may have a thickness between about 0.2 Å and about 0.4 Å. Methods provided herein may be performed at a temperature less than about 450° C. At process temperatures greater than about 450° C., some silicon-containing precursors may decompose to form a layer of silicon.

Unlike a chemical vapor deposition (CVD) or a CVD-like process, the silicon-containing precursor, in ALD process 200, does not decompose to form a silicon layer. In some embodiments, operation 106, of FIG. 1A, or operation 118, of FIG. 1B, is performed such that not all active sites on the deposited film are occupied by a silicon-containing precursor.

The silicon-containing precursor, as applied in the ALD process 200, may not include any nitrogen-hydrogen bonds, a primary or secondary amine, or any $NH_3$ groups. The silicon-containing precursor may be halogen and carbon free and may have a hydrogen to silicon atomic ratio of between about 12:3 to about 12:5.

Example silicon-containing precursors suitable for use in accordance with disclosed embodiments include polysilanes $(H_3Si—(SiH_2)_n—SiH_3)$, where $n\geq 1$, such as silane, disilane, trisilane, tetrasilane; and trisilylamine:

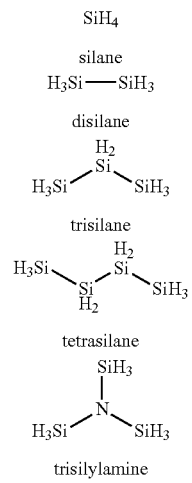

In various embodiments, the process station is optionally purged to remove excess silicon-containing precursor in gas phase that did not adsorb onto the surface of the substrate, as shown in purge phase 240A in deposition cycle 210A, and purge phase 280B in deposition cycle 210B. Purging may involve a sweep gas, which may be a carrier gas used in other operations or a different gas. In some embodiments, purging may involve evacuating the chamber. At purge phase 240A or purge phrase 240B, silicon-containing precursor, e.g. disilane, flow is turned off, no plasma is ignited, and no nitrogen is supplied to the station. The carrier gas, such as Ar gas, continues to flow to purge any excess $Si_2H_6$ from the station. In some embodiments, purge phase 240A may include one or more evacuation sub-phases for evacuating the process station. Alternatively, it will be appreciated that purge phase 240A may be omitted in some embodiments. Purge phase 240A may have any suitable duration, such as between about 0 seconds and about 60 seconds, or about 0.01 seconds. In some embodiments, increasing a flow rate of a one or more sweep gases may decrease the duration of purge phase 240A. For example, a purge gas flow rate may be adjusted according to various reactant thermodynamic characteristics and/or geometric characteristics of the process station and/or process station plumbing for modifying the duration of purge phase 240A. In one non-limiting example, the duration of a sweep phase may be adjusted by modulating sweep gas flow rate. This may reduce deposition cycle time, which may improve substrate throughput. After a purge, the silicon-containing precursors remain adsorbed onto the substrate surface.

In various embodiments, the plasma, e.g. plasma derived from $NH_3$, is an in-situ plasma, such that the plasma is formed directly above the substrate surface in the station. The in-situ plasma may be ignited at a power per substrate area between about 0.2122 W/cm$^2$ and about 2.122 W/cm$^2$. For example, the power may range from about 600 W to about 6,000 W for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that $NH_3$ is ignited in a remote plasma generator upstream of the station, and then delivered to the station where the substrate is housed.

Higher frequency plasmas may generate more radicals than ions, thereby improving deposition of silicon nitride due to higher reactivity between the radicals and the silicon-containing precursor. The radical density desired during this operation therefore depends on the plasma frequency. In various embodiments, a high frequency plasma is used having a frequency of at least about 13.56 MHz, or at least about 27 MHz, or at least about 40 MHz, or at least about 60 MHz. In some embodiments, having a higher ion density reduces conformality of the film. Moreover, in some embodiments, such as depicted in FIG. 1B, a higher ion density may be desirable to modify the film during deposition using a directional plasma.

Once the plasma activates the $NH_3$ gas, nitrogen radicals and ions react with the silicon-containing precursor adsorbed on the surface of the substrate, forming silicon-nitrogen bonds and a thin film SiN.

Figure 3:
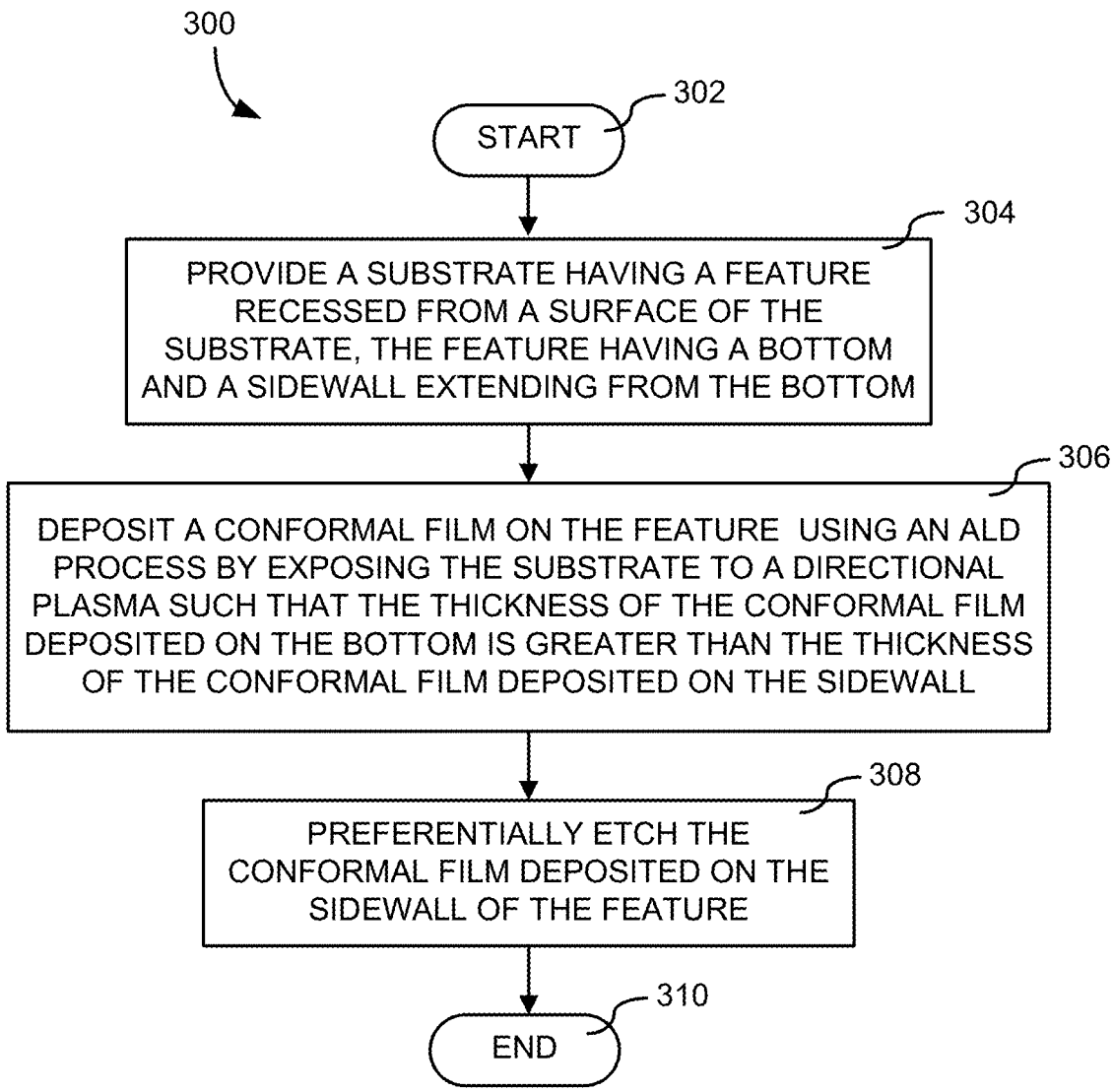
FIG. 3 is a process flow diagram for deposition of a conformal film on a substrate.

Referring to FIG. 3, a method 300 for depositing a conformal film, such as SiN or other nitrides, on the bottom of a feature is shown. The method 300 differs from methods 100A and 100B in that method 300 deposits a film at operation 306 by exposing the substrate to a $N_2$-derived plasma, rather than an $NH_3$-derived plasma, such that deposition results in a film that is thicker on the horizontal surfaces than on the sidewall surfaces of the feature.

Generally, $NH_3$-derived plasma is used in deposition to generate a film of uniform thickness upon a particular feature, as may be desirable in the method 100A shown in FIG. 1A, where the deposited film is modified for removal in a subsequent etch. In contrast, applying $N_2$-derived plasma, as shown in method 300 of FIG. 3, in short durations or "bursts" creates active sites suitable for additional deposition thereon at exposed horizontal surfaces at the top and bottom of the film. Deposition on, or the thickening of, exposed horizontal surfaces relative to the sidewalls facilitates a subsequent preferential etch of the sidewalls. However, lengthy (e.g. greater than ten seconds) application of $N_2$-derived plasma may begin to degrade deposited film at the top and bottom of the feature, thus effectively reversing the preferential etch location of the sidewalls.

The method 300 is initiated at operation 302 and proceeds to operation 304, where a substrate with a feature recessed from a surface of the substrate is provided. The substrate provided has a defined bottom and a sidewall which extends from the bottom. Next, a conformal film, e.g. silicon nitride (SiN), is deposited on the feature by an atomic layer deposition (ALD) process by exposing the substrate to a directional plasma such that the thickness of the conformal film deposited on the bottom of the feature is greater than the thickness of the conformal film deposited on the sidewalls. Exposed horizontally-oriented surfaces, such as at the bottom or top of the feature, are prepared for additional deposition thereon.

At operation 306, ion-rich, $N_2$-derived plasma is flowed toward certain areas of the deposited film, e.g. exposed horizontal surfaces at the bottom, or top of the feature, to create active sites on the film. The active sites accommodate the additional deposition of SiN thereon. Relevant plasma parameters, such as frequency, power, etc., are tuned to result in a desirable ratio of a higher concentration of ions relative to radicals. Also, plasma derived from $N_2$ gas, e.g. as used in operation 306, is delivered, or flowed, to the substrate quickly, and in short bursts, and may be provided by plasma sources such as capacitively coupled reactors (CCPs). Bias applied to a pedestal holding the substrate is optional as plasma species derived from $N_2$ gas may demonstrate inherent directionality to be directed toward certain areas, e.g. the bottom of the feature and, optionally, the top of the feature.

Active sites on deposited conformal SiN film accommodate additional deposition of SiN thereon, to thus deposit more SiN at these areas. Areas selected for this "thickening" include the bottom, and optionally the top, of the feature, such that SiN layers at such areas are relatively thicker than surrounding areas of the conformal film. After completion of deposition at operation 306, etchant species are flowed into a reaction chamber housing the substrate of interest to preferentially etch conformal film, e.g. SiN or other nitrides, deposited on sidewalls of the feature. Suitable etch parameters may include high power applied to the reaction chamber, and high pressure of etchant species flowing into the reaction chamber, as well as (optional) application of bias to a pedestal holding the substrate. The thickened areas of conformal film at the bottom, or optionally the top, of the feature remain post-etch, as shown in FIG. 6D as residual SiN deposited on field areas 608D, and bottom 610D.

Referring to FIG. 4, a temporal progression of example phases in conformal film deposition (CFD) of silicon nitride (SiN) is shown. Phases shown in FIG. 4 may occur similar to that shown earlier in FIG. 2. However, ALD process 400, for method 300 shown in FIG. 3, involves application of plasma derived from $N_2$ gas to form and deposit SiN on the feature, rather than plasma derived from $NH_3$, as shown in an example ALD deposition process 200 in FIG. 2. Similar to ALD deposition process 200, ALD deposition process 400 may include one or more deposition cycles, such as deposition cycles 410A and 410B conducted immediately after 410A until SiN deposited on the feature reaches a desired thickness.

As described above, geometrically selective deposition may be performed by (1) depositing or post-deposition treating film on horizontal surfaces to make it easier to etch than film on the sidewall surfaces, as described with reference to FIGS. 1A and 1B or (2) depositing or treating film deposited on horizontal surfaces to increase the amount of film on those surfaces relative to the sidewall surfaces, as described with reference to FIG. 3. As described above, $NH_3$-derived plasmas are more conducive to selective SiN deposition on sidewalls by mechanism (1) and $N_2$-derived plasmas are more conducive to selective SiN deposition on top and bottom surfaces by mechanism (2). That said, as explained further below, there are some embodiments in which $NH_3$ may be used for mechanism (2) and vice versa.

To deposit or post-deposition treat film on horizontal surfaces to make it easier to etch than film on the sidewall surfaces to a subsequent etch, a deposition that is primarily driven by radical deposition may be used, with the modification done by ions either during or after deposition. As described above, SiN deposition may use a plasma generated from $NH_3$. A $NH_3$ plasma drives the deposition primarily through $NH_2$ radicals and H radicals, which are long-lived and easily diffuse through a feature to deposit a film having uniform thickness and composition in the first 1 or 2 seconds. However, increasing the ion bombardment will affect the horizontal surfaces of the plasma. The ion bombardment can be made sufficiently high to damage the film on the horizontal surfaces by one or more of: increasing the number of ions in the plasma, increasing the ion energies of the ions, and increasing the plasma times. The increase can occur during deposition or as a post-deposition treatment. As described above for mechanism (1), adjustment of the ion bombardment allows the film on the horizontal surfaces to be removed by wet etch, for example, while leaving film on the sidewalls. In certain embodiments, the ion energies may be increased by adding Ar or $N_2$ to the $NH_3$. Alternatively, an Ar or $N_2$ plasma may be used to treat the film post-deposition. It should also be noted that it may be possible to use $N_2$-derived plasmas without $NH_3$ to selectively deposit on sidewall surfaces: for example, if a horizontal surface is exposed to a $N_2$-derived plasma for a long enough time (e.g., greater than ten seconds) it will damage those surfaces.

An $NH_3$-derived plasma may also be used for the embodiment described in FIG. 3—by using plasmas that have enough ionic character or duration such that the films on the horizontal surface are densified, but not damaged. For example, if a feature is exposed to a plasma generated from $NH_3$ for up to 5 seconds, that plasma may densify the horizontal surfaces without damaging them. By contrast, a plasma generated from $N_2$ (without $NH_3$) results in a film that deposits differentially on the vertical and horizontal surfaces. This is because unlike with $NH_3$, the deposition is ion-driven. Thus, an $N_2$-derived plasma may be used to both deposit more film on horizontal surfaces than on sidewall surfaces and to densify the film on the horizontal surfaces. This allows a subsequent etch to preferentially etch the sidewall surfaces.

While the above explanation is provided for deposition of SiN, the methods or processes described may be extrapolated to deposition of other films: radical driven deposition chemistries may be used to selectively form films on sidewall surfaces and ion driven deposition chemistries may be used to selectively form films on horizontal surfaces by the mechanisms described above.

EXPERIMENTAL

FIGS. 5A-5C depict side views of feature 502 during operations of a process as described above. As shown in FIG. 5A, a thin film 504 is conformal with feature 502. Areas targeted for modification upon application of directional plasma include top areas 508A that extend perpendicularly from sidewalls 512 of the feature, and bottom area 510, which is parallel to the top area 508A and connects one sidewall 512 to the next as shown in FIG. 5A.

Plasma derived from $NH_3$ is directionally flowed to areas targeted for modification. Bottom area 510A and, optionally, top areas 508A are modified or damaged upon application of directional plasma as shown by modified bottom 510B and modified top areas 508B in FIG. 5B. Modified areas, e.g. modified bottom 510B and modified top areas 508B, are then exposed to etchant species, as shown in FIG. 5B, which function to etch and remove the modified areas allowing only the sidewalls 512 to remain post-etch, as shown in FIG. 5C.

Figures 5D, 5E:
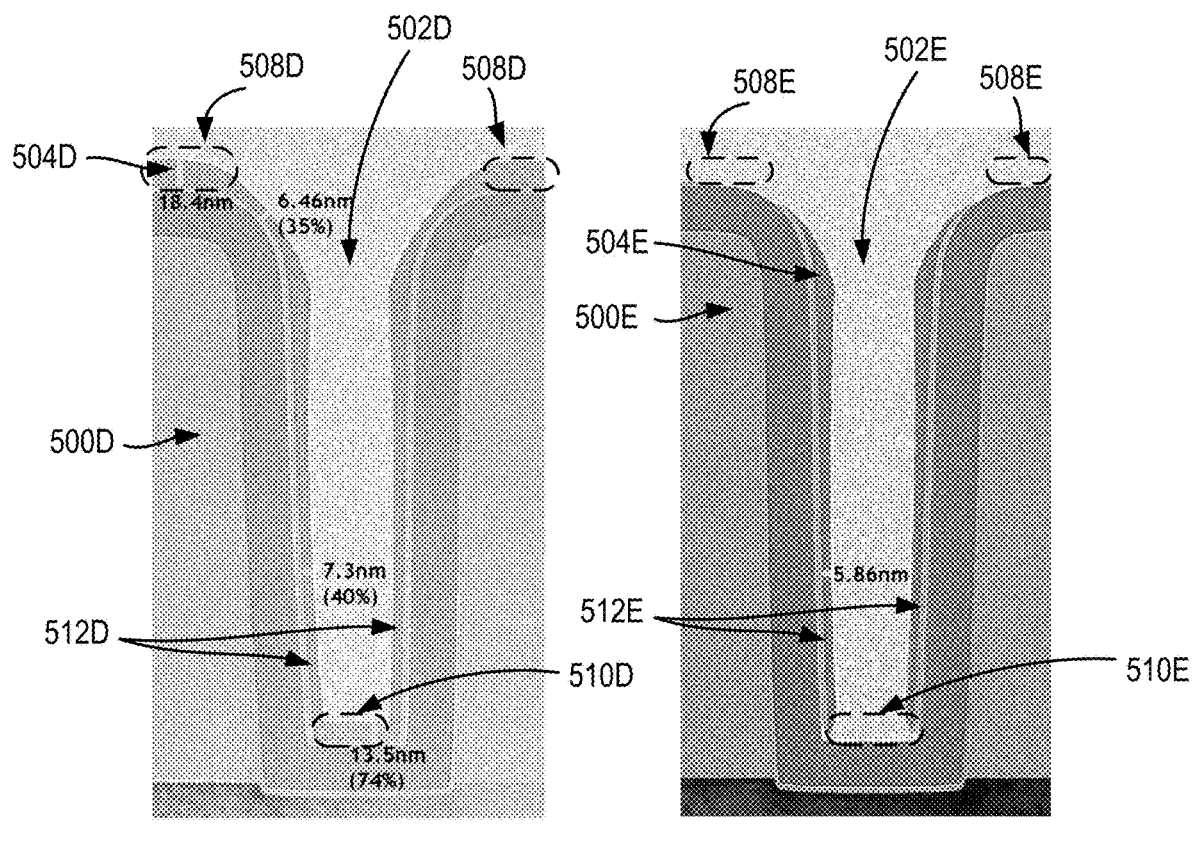
FIGS. 5D and 5E are images of experimental results.

FIGS. 5D and 5E show experimental results for that shown in FIGS. 5A-5C. Referring to FIG. 5D, conformal SiN film 504D was deposited on substrate 500D. Conformal film 504D was deposited with a thickness of approximately 18.4 nm on the substrate 500D, which has a feature 502D formed therein. A process chamber power setting of approximately 1,500 W was used to input carbon into the sidewalls 512D, while a power setting of 150 W was used for plasma pulsing.

As shown in FIG. 5D, conformal film 504D was deposited on the re-entrant portion 506D at a depth, or thickness, or approximately 6.46 nm, such that sidewalls 512D each had a width, or thickness, of approximately 7.3 nm. Conformal film 504D was deposited on bottom 510D at a depth of approximately 13.5 nm. In various embodiments, height or width values of conformal film 504D deposited on feature 502D of substrate may correspond to specific step-coverage percentages, as discussed earlier, as shown in FIG. 5D. Each sidewall 512D with a thickness of 7.3 nm had a step-coverage percentage of 40% and bottom 510D, with a thickness of 13.5 nm, had a step-coverage percentage of 74%.

That shown by FIG. 5D involved the deposition of silicon nitride (SiN) conformal film 504D formed from trisilylamine (TSA), as the silicon-containing source and $NH_3$ as the nitrogen-containing source, or reactant. Deposition processes resulting in deposition of conformal film 504D, as shown in FIG. 5D, were tuned for concurrent modification, or damage, of the conformal film 504D at targeted top areas 508D and the bottom 510D. Ion-bombardment provided by directional plasma flowed toward the top areas 508D and the bottom 510D modified the areas to make them dispersed or fluffier and thus more susceptible to removal upon etch. A wet etch was conducted with hydrofluoric (HF) acid at a concentration of 100:1 to etch the top areas 508D and the bottom 510D to arrive at that shown by FIG. 5E.

As shown in FIG. 5E, etchant species were flowed toward the substrate 500E to etch and remove the modified areas, e.g. top areas 508E and bottom 510E. Further, sidewalls 512E were etched to a width, or thickness, of 5.86 nm.

Figure 6A:
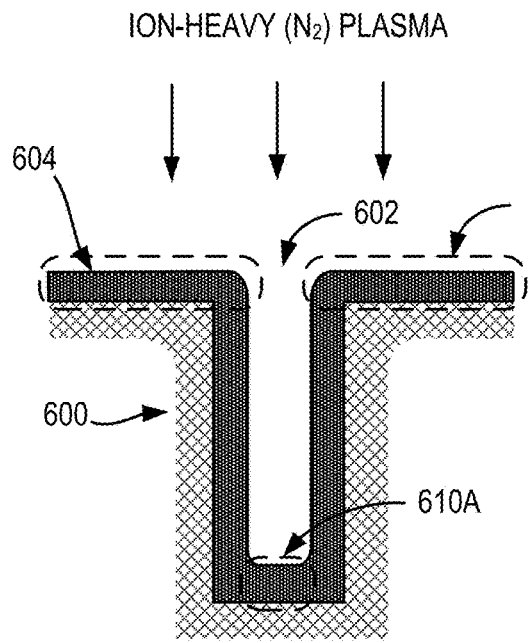
FIGS. 6A-6D are schematic illustrations that show application of plasma on a conformal film.
Figure 6B:
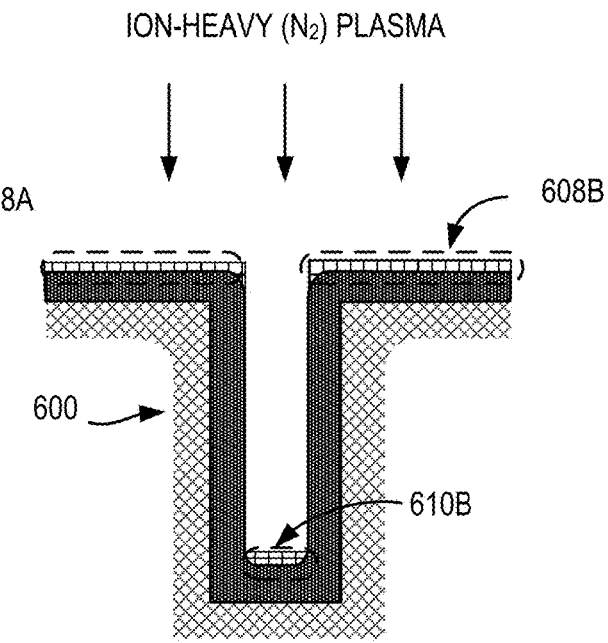
Figure 6C:
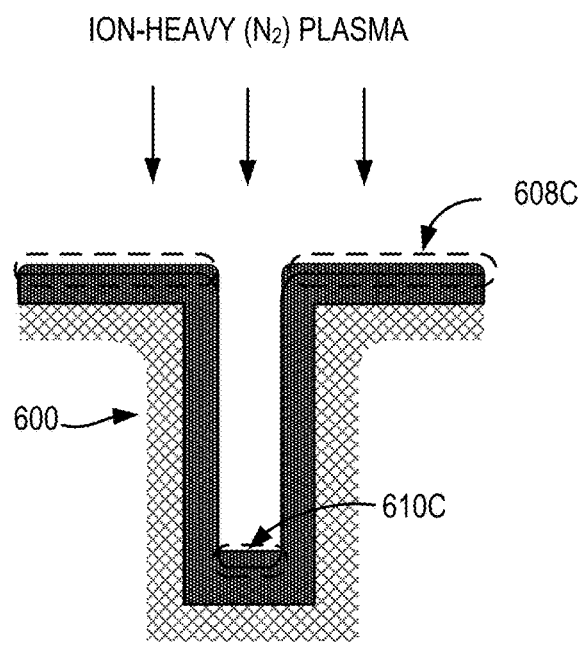
Figure 6D:
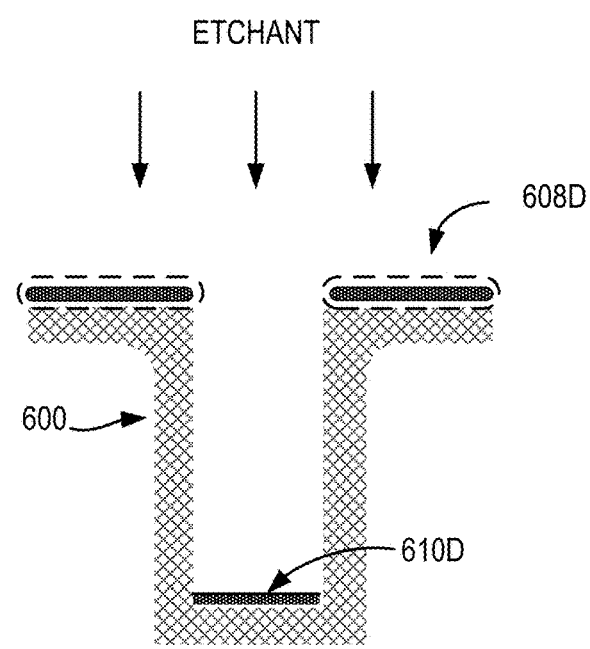

FIGS. 6A-6D depict side views of feature 602, e.g. shown as a trench, formed in a wafer, or non-planar semiconductor substrate 600 in various phases of the deposition and etch processes shown and described for FIGS. 3 and 4 above. FIG. 6A shows a conformal film 604 deposited on substrate 600 with feature 602 formed therein. Conformal film 604 may be deposited on feature 602 as described earlier for FIG. 5A. However, instead of application of directional plasma derived from $NH_3$ sources, ion-heavy $N_2$-derived plasma is directionally applied as shown in FIG. 6B to create active sites on exposed horizontal surfaces of conformal film 604, such as at bottom 610B and (optionally) at top areas 608B. Such active sites accommodate additional deposition of SiN thereon, as shown in the thickened top areas 608C and 610C shown in FIG. 6C. The thickened areas 608C and 610C remain through a subsequent etch of film 604, such as either a wet or dry etch, as shown as top areas 608D and bottom 610D. In detail, etchant species etches film 604 on the top areas 608C, sidewalls, and the bottom 610C to remove film deposited on the sidewalls, as shown in FIG. 6D. Thickened areas 608C and 610C, e.g. areas with additional SiN deposited thereon, are partially etched, but remain as top areas 608D and bottom 610D.

Referring now to FIGS. 6E-6F, various images of experimental results showing variance in step-coverage as dependent on type of plasma used, e.g. that derived from $NH_3$, compared to that derived from $N_2$, are shown. Primary differences may include poor film conformality when using $N_2$-derived plasma, compared to $NH_3$-derived plasma, due to the short lifetime of nitrogen radicals generated from $N_2$ plasma. Accordingly, as shown in FIG. 6E, poor step coverage, e.g. less than 50% is observed between bottom 610E and top areas 608E. In contrast, $NH_3$-derived plasma, when applied in a process with identical parameters, or process condition sequence, achieves greater than 95% step coverage, as shown comparing bottom 610F to top 608F in FIG. 6F. Thus, a longer exposure time is required to saturate the bottom 610E of the feature of the substrate when using $N_2$-derived plasma, in comparison to $NH_3$-derived plasma.

FIGS. 6G-6I show efforts to improve deposited film conformality using $N_2$-derived plasma by extending plasma exposure, such as radio frequency (RF) plasma exposure, time. A short RF plasma exposure time corresponds to less than 50% step coverage, as shown between bottom 610G and top areas 608G in FIG. 6G. In contrast, incrementally longer RF exposure times correspond to improved step coverage, e.g. greater than 70%, as shown in FIG. 6H and greater than 90% in FIG. 6I.

Apparatus

Figure 7:
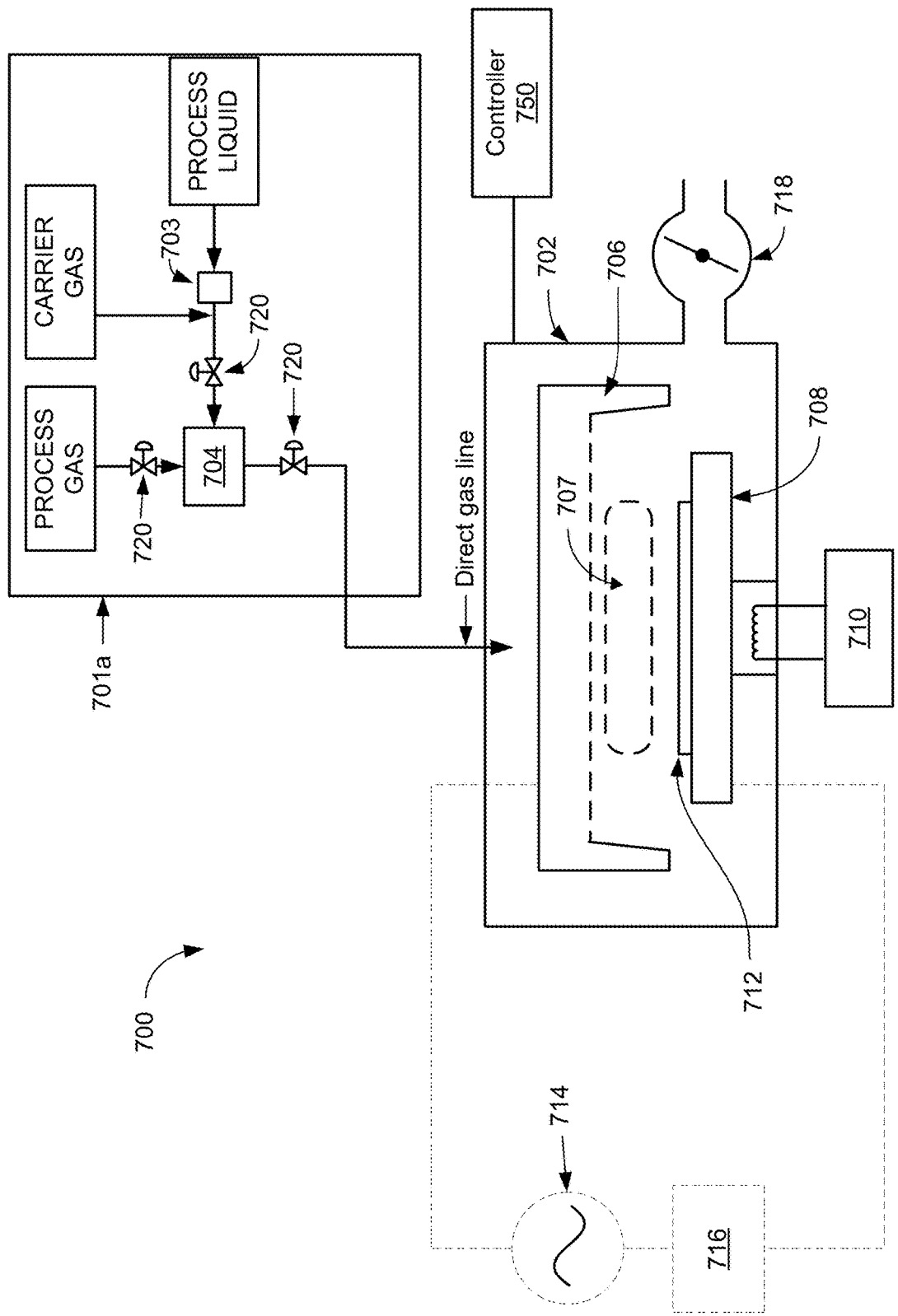
FIG. 7 is a schematic diagram of an example process station for performing certain disclosed embodiments.

FIG. 7 depicts a schematic illustration of an embodiment of an atomic layer deposition (ALD) process station 700 having a process chamber body 702 for maintaining a low-pressure environment. A plurality of ALD process stations 700 may be included in a common low pressure process tool environment. For example, FIG. 7 depicts an embodiment of a multi-station processing tool 700. In some embodiments, one or more hardware parameters of ALD process station 700, including those discussed in detail below, may be adjusted programmatically by one or more computer controllers 750.

ALD process station 700 fluidly communicates with reactant delivery system 701a for delivering process gases to a distribution showerhead 706. Reactant delivery system 701a includes a mixing vessel 704 for blending and/or conditioning process gases for delivery to showerhead 706. One or more mixing vessel inlet valves 720 may control introduction of process gases to mixing vessel 704.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 304.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some embodiments, a microvolume 707 is located beneath showerhead 706. Practicing disclosed embodiments in a microvolume rather than in the entire volume of a process station may reduce reactant exposure and purge times, may reduce times for altering process parameters (e.g., pressure, temperature, etc.) may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 708 may be raised or lowered to expose substrate 712 to microvolume 707 and/or to vary a volume of microvolume 707. For example, in a substrate transfer phase, pedestal 708 may be raised to position substrate 712 within microvolume 707. In some embodiments, microvolume 707 may completely enclose substrate 712 as well as a portion of pedestal 708 to create a region of high flow impedance.

Optionally, pedestal 708 may be lowered and/or raised during portions the process to modulate process pressure, reactant concentration, etc., within microvolume 707. In one scenario where process chamber body 702 remains at a base pressure during the process, lowering pedestal 708 may allow microvolume 707 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 750.

In another scenario, adjusting a height of pedestal 708 may allow a plasma density to be varied during plasma activation cycles included in the process. At the conclusion of the process phase, pedestal 708 may be lowered during another substrate transfer phase to allow removal of substrate 712 from pedestal 708.

While the example microvolume variations described herein refer to a height-adjustable pedestal 708, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In some embodiments where plasma may be used as discussed above, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are included above. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting parameters for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as disilane), instructions for setting a flow rate of a carrier gas (such as Ar), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the plasma reactant such as nitrogen), instructions for modulating a flow rate of a carrier gas, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 708 may be temperature controlled via heater 710. Further, in some embodiments, pressure control for process station 700 may be provided by butterfly valve 718. As shown in the embodiment of FIG. 7, butterfly valve 718 throttles a vacuum provided by a downstream vacuum pump (not shown in FIG. 7). However, in some embodiments, pressure control of process station 700 may also be adjusted by varying a flow rate of one or more gases introduced to the process station 700.

Figure 8:
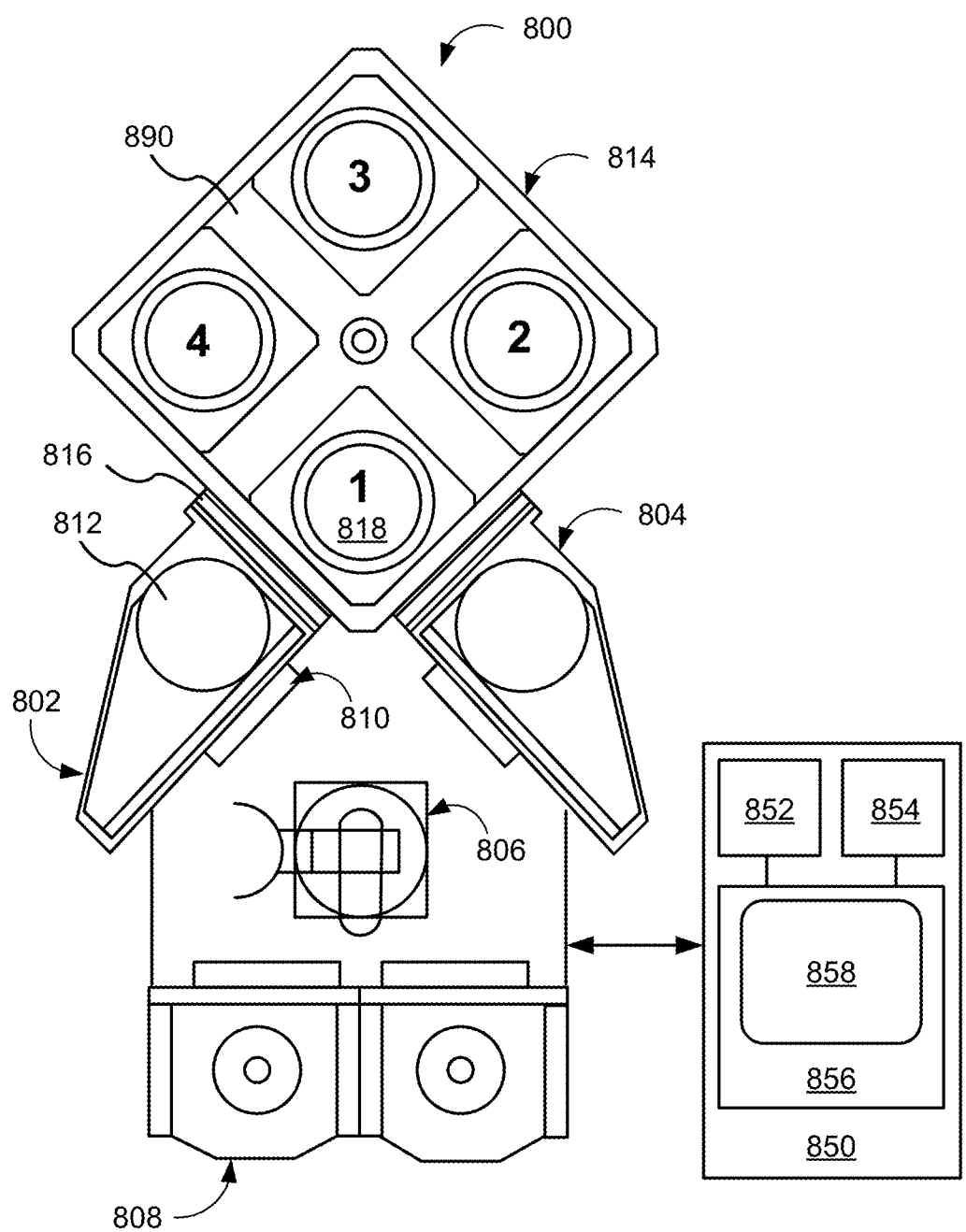
FIG. 8 depicts an example of a schematic view of a multi-station processing tool.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source. A robot 806, at atmospheric pressure, is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to a remote plasma treatment in the load lock prior to being introduced into a processing chamber 814. Further, the substrate, or wafer, also may be heated in the inbound load lock 802 as well, for example, to remove moisture and adsorbed gases. Next, a chamber transport port 816 to processing chamber 814 is opened, and another robot (not shown in FIG. 8) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an atomic layer deposition (ALD) and plasma-enhanced ALD process mode. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 used to control process parameters and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., TMA, ammonia, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process parameters, and user input devices such as pointing devices, keyboards, touch screens, microphones, etc.

In some embodiments, parameters adjusted by system controller 850 may relate to process parameters. Non-limiting examples include process gas composition and flow rates, temperature, pressure, plasma parameters (such as RF bias power levels), pressure, temperature, etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process parameters.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 may communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method, comprising:
   providing a substrate having a feature recessed from a surface of the substrate, the feature having a bottom and a sidewall extending from the bottom;
   depositing a conformal silicon nitride (SiN) film on the feature wherein the SiN film is deposited from a first plasma containing $NH_2$ radicals and H radicals;
   and after depositing the conformal SiN film, modifying the conformal SiN film deposited on the bottom by exposing the substrate to a second plasma, the second plasma having a higher concentration of ions than radicals and a higher ion density than the first plasma.

2. The method of claim 1, wherein the first plasma is generated from $NH_3$.

3. The method of claim 1, wherein the second plasma is generated from $N_2$.

4. The method of claim 1, wherein the deposition of the conformal SiN film comprises is driven by a reaction of $NH_2$ radicals with silicon-containing precursor adsorbed on the surface of the substrate.

5. The method of claim 4, wherein the silicon-containing precursor is an amine.

6. The method of claim 1, wherein depositing the conformal SiN film and modifying the conformal SiN film are performed in a multi-station chamber.

7. The method of claim 6, wherein depositing the conformal SiN film and modifying the conformal SiN film are performed in different stations of the multi-station chamber.

8. The method of claim 1, further comprising preferentially etching the conformal SiN film deposited on the sidewall of the feature.

9. The method of claim 8, wherein the etching comprises a plasma etch.

10. The method of claim 8, wherein the etching comprises a wet etch.

11. The method of claim 10, wherein the second plasma is generated from $N_2$ without $NH_3$.

* * * * *